(12) United States Patent
Fukui et al.

(10) Patent No.: US 11,370,033 B2
(45) Date of Patent: Jun. 28, 2022

(54) SURFACE COATED CUTTING TOOL AND METHOD FOR MANUFACTURING THE SAME

(71) Applicant: SUMITOMO ELECTRIC HARDMETAL CORP., Itami (JP)

(72) Inventors: Haruyo Fukui, Itami (JP); Makoto Setoyama, Itami (JP); Keizo Tanaka, Itami (JP); Kouhei Yoshimura, Itami (JP)

(73) Assignee: SUMITOMO ELECTRIC HARDMETAL CORP., Itami (JP)

( * ) Notice: Subject to any disclaimer, the term of this patent is extended or adjusted under 35 U.S.C. 154(b) by 8 days.

(21) Appl. No.: 16/957,956

(22) PCT Filed: Oct. 30, 2018

(86) PCT No.: PCT/JP2018/040255
§ 371 (c)(1),
(2) Date: Jun. 25, 2020

(87) PCT Pub. No.: WO2019/171653
PCT Pub. Date: Sep. 12, 2019

(65) Prior Publication Data
US 2020/0368822 A1 Nov. 26, 2020

(30) Foreign Application Priority Data

Mar. 7, 2018 (JP) .............................. JP2018-040875

(51) Int. Cl.
*B23B 27/14* (2006.01)
*C23C 14/06* (2006.01)
(Continued)

(52) U.S. Cl.
CPC .......... *B23B 27/148* (2013.01); *C23C 14/024* (2013.01); *C23C 14/0641* (2013.01); *C23C 14/0664* (2013.01); *C23C 28/044* (2013.01); *C23C 28/42* (2013.01); *C23C 28/44* (2013.01); *B23B 2222/28* (2013.01); *B23B 2224/08* (2013.01); *B23B 2224/32* (2013.01); *B23B 2224/36* (2013.01); *B23C 5/16* (2013.01); *C23C 14/325* (2013.01)

(58) Field of Classification Search
CPC ... B23B 27/14; B23B 27/148; B23B 2224/24; B23B 2228/08; B23B 2228/105; C23C 14/0641; C23C 28/42
(Continued)

(56) References Cited

U.S. PATENT DOCUMENTS

2003/0148145 A1    8/2003   Yamamoto et al.
2007/0172694 A1    7/2007   Yamamoto
(Continued)

FOREIGN PATENT DOCUMENTS

JP    2003-034859 A    2/2003
JP    2004-42193 A     2/2004
(Continued)

*Primary Examiner* — Archene A Turner
(74) *Attorney, Agent, or Firm* — Faegre Drinker Biddle & Reath LLP (57) ABSTRACT

A surface coated cutting tool comprises a base material and a coating layer that coats the base material, the coating layer including an alternate layer composed of a first unit layer and a second unit layer alternately stacked, the first unit layer being composed of a nitride containing aluminum and zirconium, in the first unit layer, when the total number of metal atoms constituting the first unit layer is represented as 1, a ratio thereto of the number of atoms of the zirconium being not less than 0.65 and not more than 0.95, the second unit layer being composed of a nitride containing titanium and silicon, in the second unit layer, when the total number of metal atoms constituting the second unit layer is represented as 1, a ratio thereto of the number of atoms of the silicon being larger than 0 and not more than 0.20.

15 Claims, 3 Drawing Sheets

(51) Int. Cl.
  *C23C 28/04* (2006.01)
  *C23C 28/00* (2006.01)
  *C23C 14/02* (2006.01)
  *C23C 14/32* (2006.01)
  *B23C 5/16* (2006.01)

(58) Field of Classification Search
  USPC .......................................................... 428/697
  See application file for complete search history.

(56) References Cited

U.S. PATENT DOCUMENTS

| | | | |
|---|---|---|---|
| 2007/0269610 A1 | 11/2007 | Fukui et al. | |
| 2010/0038232 A1 | 2/2010 | Yamamoto | |
| 2015/0275348 A1* | 10/2015 | Joesaar | C23C 28/044 |
| | | | 428/216 |
| 2016/0032444 A1* | 2/2016 | Johnson | C23C 14/0641 |
| | | | 407/119 |
| 2018/0117680 A1* | 5/2018 | Tanaka | B23B 51/00 |
| 2018/0245201 A1* | 8/2018 | Park | C23C 14/18 |

FOREIGN PATENT DOCUMENTS

| | | |
|---|---|---|
| JP | 2005-28474 A | 2/2005 |
| JP | 2007-191765 A | 8/2007 |
| JP | 2010-180479 A | 8/2010 |
| JP | 2010-247262 A | 11/2010 |
| JP | 2011-167784 A | 9/2011 |
| JP | 2011-212786 A | 10/2011 |
| JP | 2015-512791 A | 4/2015 |
| WO | WO-2006/070730 A1 | 7/2006 |
| WO | WO-2013/120614 A1 | 8/2013 |

* cited by examiner

SURFACE COATED CUTTING TOOL AND METHOD FOR MANUFACTURING THE SAME

TECHNICAL FIELD

The present invention relates to a surface coated cutting tool and a method for manufacturing the same. The present application claims priority based on Japanese Patent Application No. 2018-040875 filed on Mar. 7, 2018. The entire contents described in the Japanese patent application are incorporated herein by reference.

BACKGROUND ART

In recent years, dry processing using no cutting oil solution has increasingly been demanded from the standpoint of protection of global environment, cutting speed has further been increased so as to improve processing efficiency, and materials to be cut have been diversified and heat-resistant alloys referred to as difficult-to-cut materials are increasingly cut in the fields of aircraft and medical treatment. For these and other grounds, in a cutting process, a surface coated cutting tool tends to have a cutting edge heated to high temperature. The surface coated cutting tool having the cutting edge heated to high temperature would have a reduced lifetime. Accordingly, there is a demand for a surface coated cutting tool that can exhibit excellent tool life even under such severe cutting conditions.

Japanese Patent Laying-Open No. 2003-34859 (PTL1) discloses a coating layer comprising a composition of $(Al_b, [Cr_{1-e}V_e]_c) (C_{1-d}N_d)$ (where $0.5 \leq b \leq 0.8$, $0.2 \leq c \leq 0.5$, $b+c=1$, $0.05 \leq e \leq 0.95$, $0.5 \leq d \leq 1$) or a composition of $(M_a, Al_b, [Cr_{1-e}V_e]_c) (C_{1-d}N_d)$ (where M is at least one selected from the group consisting of Ti, Nb, W, Ta and Mo, and $0.02 \leq a \leq 0.3$, $0.5 \leq b \leq 0.8$, $0.05 \leq c$, $a+b+c=1$, $0.5 \leq d \leq 1$, $0 \leq e \leq 1$) for the purpose of improving a cutting tool in wear resistance in high-speed and high-efficiency cutting.

WO 2006/070730 (PTL2) discloses a coating layer including alternate layers formed of an A layer, which is composed of a nitride of Al and Cr, and a B layer, which is composed of a nitride of Ti and Al, alternately stacked for the purpose of highly efficient dry processing.

CITATION LIST

Patent Literature

PTL 1: Japanese Patent Laying-open No. 2003-34859
PTL 2: WO 2006/070730

SUMMARY OF INVENTION

A surface coated cutting tool in one aspect of the present disclosure is

[1] a surface coated cutting tool comprising a base material and a coating layer that coats the base material, the coating layer including an alternate layer composed of a first unit layer and a second unit layer alternately stacked, the first unit layer being composed of a nitride containing aluminum and zirconium, in the first unit layer, when the total number of metal atoms constituting the first unit layer is represented as 1, a ratio thereto of the number of atoms of the zirconium being not less than 0.65 and not more than 0.95, the second unit layer being composed of a nitride containing titanium and silicon, in the second unit layer, when the total number of metal atoms constituting the second unit layer is represented as 1, a ratio thereto of the number of atoms of the silicon being larger than 0 and not more than 0.20.

A method for manufacturing a surface coated cutting tool in another aspect of the present disclosure is

[2] a method for manufacturing the surface coated cutting tool of item (1) above, comprising:

preparing the base material; and alternately stacking the first unit layer and the second unit layer on the base material through physical vapor deposition to form the alternate layer on the base material to obtain the surface coated cutting tool.

DETAILED DESCRIPTION

Problem to be Solved by the Present Disclosure

Heat-resistant alloys represented by Inconel® or the like used for aircraft engines and the like often contain Cr. The coating layers of PTLs 1 and 2 described above contain Cr. Therefore, when these cutting tools are used to cut a heat-resistant alloy, there is a technical problem as Cr in the coating layer and Cr in the workpiece interdiffuse and accelerate damage to the coating layer.

An object is to provide a surface coated cutting tool achieving a long life even when it is used to process difficult-to-cut materials, in particular, and a method for manufacturing the same.

Advantageous Effect of the Present Disclosure

According to the above aspect, there can be provided a surface coated cutting tool achieving a long life even when it is used to process difficult-to-cut materials, in particular, and a method for manufacturing the same.

Description of Embodiments of the Present Disclosure

Initially, embodiments of the present disclosure will be enumerated and specifically described.

(1) A surface coated cutting tool in one aspect of the present disclosure is a surface coated cutting tool comprising a base material and a coating layer that coats the base material, the coating layer including an alternate layer composed of a first unit layer and a second unit layer alternately stacked, the first unit layer being composed of a nitride containing aluminum and zirconium, in the first unit layer, when the total number of metal atoms constituting the first unit layer is represented as 1, a ratio thereto of the number of atoms of the zirconium being not less than 0.65 and not more than 0.95, the second unit layer being composed of a nitride containing titanium and silicon, in the second unit layer, when the total number of metal atoms constituting the second unit layer is represented as 1, a ratio thereto of the number of atoms of the silicon being larger than 0 and not more than 0.20.

Such a surface coated cutting tool can achieve a long life while processing a difficult-to-cut material.

(2) When in the alternate layer the first unit layer and the second unit layer which are adjacent to each other have a thickness λ1 and a thickness λ2, respectively, a ratio λ2/λ1 is preferably not less than 1 and not more than 5. This allows the surface coated cutting tool to as a whole provide increased heat dissipation, and hence enhances the surface coated cutting tool in wear resistance when it is used for continuous cutting, in particular.

(3) The first unit layer contains silicon, and in the first unit layer, when the total number of metal atoms constituting the first unit layer is represented as 1, a ratio thereto of the number of atoms of the silicon is preferably larger than 0 and not more than 0.20. This allows the coating layer to have high hardness.

(4) The first unit layer contains boron, and in the first unit layer, when the total number of metal atoms constituting the first unit layer is represented as 1, a ratio thereto of the number of atoms of the boron is preferably larger than 0 and not more than 0.10. This allows the coating layer to have high hardness.

(5) The second unit layer contains boron, and in the second unit layer, when the total number of metal atoms constituting the second unit layer is represented as 1, a ratio thereto of the number of atoms of the boron is preferably larger than 0 and not more than 0.10. This allows the coating layer to have high hardness.

(6) The first unit layer contains vanadium, and in the first unit layer, when the total number of metal atoms constituting the first unit layer is represented as 1, a ratio thereto of the number of atoms of the vanadium is preferably larger than 0 and not more than 0.30. This can suppress seizing of the workpiece with the surface coated cutting tool.

(7) The second unit layer contains vanadium, and in the second unit layer, when the total number of metal atoms constituting the second unit layer is represented as 1, a ratio thereto of the number of atoms of the vanadium is preferably larger than 0 and not more than 0.30. This can suppress seizing of the workpiece with the surface coated cutting tool.

(8) Preferably the first unit layer and the second unit layer each have a thickness of not less than 0.002 μm and not more than 0.2 μm. This can suppress extension of cracking.

(9) Preferably the coating layer includes an underlying layer disposed between the base material and the alternate layer and the underlying layer has a composition identical to that of the first unit layer or the second unit layer.

When the underlying layer has the same composition as the first unit layer, and the base material is exposed in an early stage of a cutting process, oxidation from an interface between the base material and the coating layer can be suppressed. When the underlying layer has the same composition as the second unit layer, the coating layer can have increased resistance against peeling when the cutting tool is used for interrupted processing such as milling and end milling.

(10) Preferably, the coating layer includes a front surface layer disposed on the side of a front surface of the alternate layer, and the front surface layer is composed of a carbonitride containing titanium. This allows the surface coated cutting tool to achieve a longer life.

(11) According to another aspect of the present disclosure, a method for manufacturing a surface coated cutting tool is a method for manufacturing a surface coated cutting tool according to any one of items (1) to (10) above, and comprises:

preparing the base material; and alternately stacking the first unit layer and the second unit layer on the base material through physical vapor deposition to form the alternate layer on the base material to obtain the surface coated cutting tool.

The coating layer formed through physical vapor deposition can have high crystallinity and excellent wear resistance. The obtained surface coated cutting tool can thus achieve a long life.

Details of Embodiment of the Present Disclosure

A specific example of a surface coated cutting tool according to an embodiment of the present disclosure will now be described with reference to the drawings below.

In the present specification, when a compound is represented by a chemical formula without specifying any specific atomic ratio, it includes any conventionally known atomic ratio and is not necessarily limited to an atomic ratio falling within the stoichiometric range. For example, for "ZrAlN," "Zr (zirconium)," "Al (aluminum)" and "N (nitrogen)" have an atomic ratio which is not limited to 25:25:50 and instead includes any conventionally known atomic ratio, and for "AlTiN," "Al," "Ti" and "N" have an atomic ratio which is not limited to 25:25:50 and instead includes any conventionally known atomic ratio.

<Surface Coated Cutting Tool>

Figure 1:
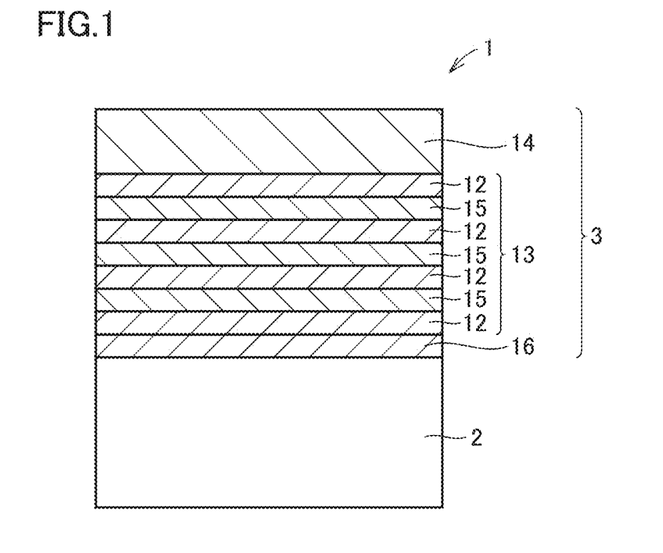
FIG. 1 is a schematic enlarged cross section of a surface coated cutting tool according to an embodiment of the present disclosure.
Figure 2:
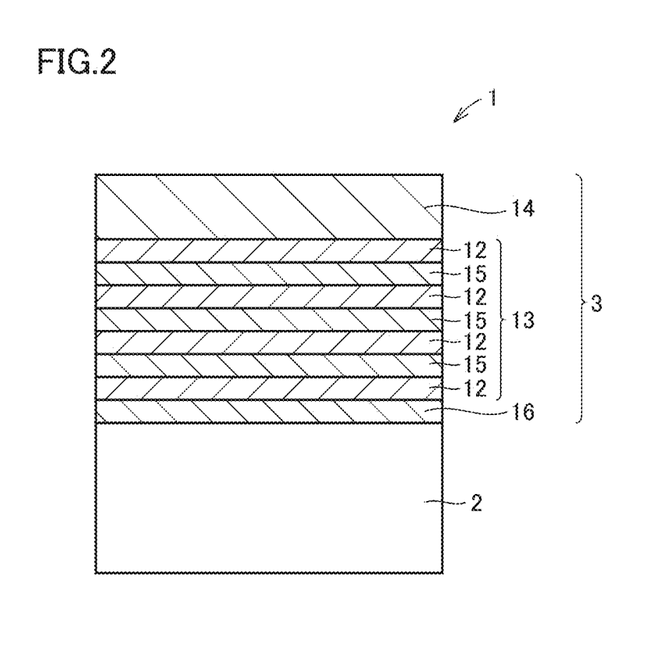
FIG. 2 is a schematic enlarged cross section of a surface coated cutting tool according to another embodiment of the present disclosure.
Figure 3:
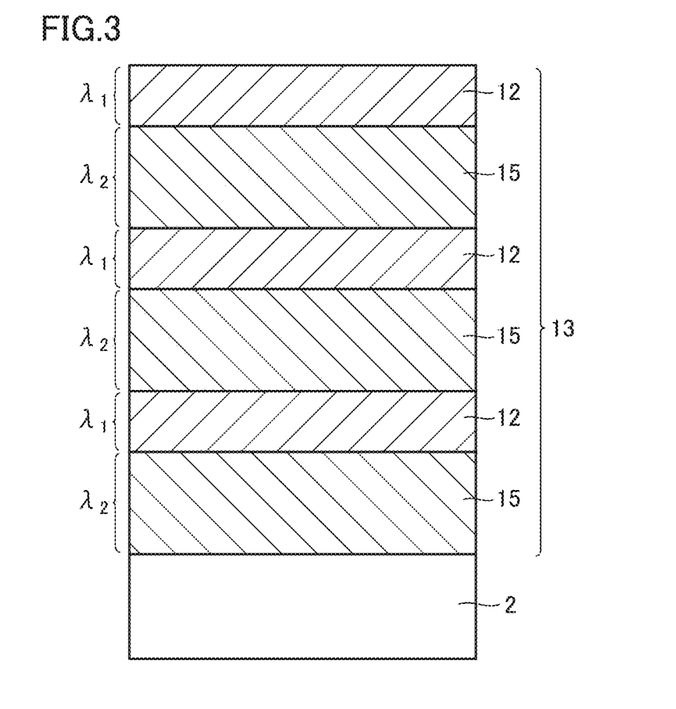
FIG. 3 is a diagram for illustrating an example of a ratio in thickness of a first unit layer and a second unit layer.

A surface coated cutting tool according to an embodiment of the present disclosure will now be described with reference to FIGS. 1 to 3. FIG. 1 is a schematic enlarged cross section of a surface coated cutting tool according to an embodiment of the present disclosure. FIG. 2 is a schematic enlarged cross section of a surface coated cutting tool according to another embodiment of the present disclosure. FIG. 3 is a diagram for illustrating an example of a ratio in thickness of a first unit layer and a second unit layer.

As shown in FIGS. 1 and 2, according to an embodiment of the present disclosure, a surface coated cutting tool 1 includes a base material 2 and a coating layer 3 that coats base material 2. Preferably, coating layer 3 coats the entire surface of base material 2. However, even if base material 2 is partially uncoated with coating layer 3 or coating layer 3 is partially different in configuration, such does not depart from the scope of the present embodiment.

A surface coated cutting tool according to the present embodiment can suitably be used as a cutting tool such as drills, end mills, indexable cutting inserts for drills, indexable cutting inserts for end mills, indexable cutting inserts for milling, indexable cutting inserts for turning, metal saws, gear cutting tools, reamers, taps, and the like.

<Base Material>

Base material 2 used for surface coated cutting tool 1 of the present embodiment can be any base material conventionally known as a base material of this type. For example, it is preferably any of a cemented carbide (for example, a WC-base cemented carbide or a material containing WC and in addition, Co, or a carbonitride of Ti, Ta, Nb, or the like added), a cermet (mainly composed of TiC, TiN, TiCN, or the like), a high-speed steel, a ceramic material (titanium carbide, silicon carbide, silicon nitride, aluminum nitride, aluminum oxide, and the like), a cubic crystal boron nitride sintered material, or a diamond sintered material, for example.

Of these various types of base materials, it is particularly preferable to select a WC-base cemented carbide or a cermet (a TiCN-base cermet, in particular). These base materials are particularly excellent in balance between hardness and strength at high temperature, and when they are used as a base material of a surface coated cutting tool, it can contribute to providing the surface coated cutting tool with a long lifetime.

<Coating Layer>

Coating layer 3 included in surface coated cutting tool 1 of the present embodiment includes an alternate layer 13 composed of first unit layer 12 and second unit layer 15 alternately stacked. Coating layer 3 can include another layer in addition to alternate layer 13. The other layer can for example be an underlying layer 16 (ZrAlN, ZrAlSiN, ZrAlBN, ZrAlVN, AlTiSiN, etc.), a front surface layer 14 (AlTiCN, AlTiSiCN, AlTiBCN, AlTiVCN, etc.) and the like.

Coating layer 3 coats base material 2 to provide an effect to improve the surface coated cutting tool's various properties such as wear resistance and chipping resistance and increase its lifetime.

The coating layer preferably has an overall thickness of not less than 0.8 μm and not more than 15 μm. If the coating layer has an overall thickness of less than 0.8 μm, the coating layer is excessively small in thickness, and the surface coated cutting tool tends to have a short life. If it is thicker than 15 μm, the coating layer tends to chip in an initial stage cutting, and the surface coated cutting tool tends to have a short life. The coating layer's overall thickness can be determined by observing a cross section of the coating layer with a scanning electron microscope (SEM). Specifically, a sample in cross section is observed with a magnification of 5,000 to 10,000 times in an area of 100 to 500 μm$^2$, and in one field of view, three locations are subject to measurement in thickness in width and their average is determined as "thickness." The same applies to the thickness of each layer described later unless otherwise specified.

The coating layer preferably has compressive residual stress of not more than 6 GPa in absolute value. The coating layer's compressive residual stress is a type of internal stress (inherent strain) present throughout the coating layer, and refers to stress represented by a negative numerical value (in "GPa" in the present embodiment). Accordingly, the concept that compressive residual stress is large indicates that a numerical value is increased in absolute value, and the concept that compressive residual stress is small indicates that a numerical value is decreased in absolute value. That is, compressive residual stress having an absolute value of not more than 6 GPa means that a preferable compressive residual stress for the coating layer is not less than −6 GPa and not more than 0 GPa.

If the coating layer's compressive residual stress exceeds 0 GPa, it will be a tensile stress, and the coating layer tends to be unable to suppress extension of a crack caused at an outermost surface of the coating layer. If the compressive residual stress has an absolute value exceeding 6 GPa, the stress is excessively large, and before cutting starts, the coating layer may be peeled off an edge of the surface coated cutting tool, in particular, and the surface coated cutting tool may have a reduced lifetime.

The compressive residual stress can be measured in the $\sin^2 \varphi$ method using an X-ray residual stress measuring apparatus (see "X-Ray Stress Measurement," The Society of Materials Science, Japan, 1981, Published by Yokendo Co., Ltd., pp. 54-66).

The coating layer preferably has a cubic crystal structure. When the coating layer has a cubic crystal structure, the coating layer is enhanced in hardness. Accordingly, each layer in the coating layer preferably has the cubic crystal structure. The crystal structure of the coating layer and each layer in the coating layer can be analyzed using an X-ray diffractometer known in the art.

The coating layer preferably has a hardness of not less than 29 GPa and not more than 60 GPa, more preferably not less than 40 GPa and not more than 60 GPa. This allows the coating layer to have sufficient hardness. The coating layer's overall hardness can be measured in a nano indenter method (Nano Indenter XP manufactured by MTS). Specifically, the coating layer has a surface measured at three locations in hardness and an average value thereof is defined as "hardness."

<Alternate Layer>

In the present embodiment, coating layer 3 includes alternate layer 13 composed of first unit layer 12 and second unit layer 15 alternately stacked. The first unit layer is composed of a nitride containing Al (aluminum) and Zr (zirconium), and when the total number of metal atoms constituting the first unit layer is represented as 1, a ratio thereto of the number of atoms of the Zr is not less than 0.65 and not more than 0.95. The second unit layer is composed of a nitride containing Ti (titanium) and Si (silicon), and when the total number of metal atoms constituting the second unit layer is represented as 1, a ratio thereto of the number of atoms of the Si is larger than 0 and not more than 0.20.

In the present specification, a "metal atom" refers to an atom of an element other than hydrogen, helium, neon, argon, krypton, xenon, radon, fluorine, chlorine, bromine, iodine, astatine, oxygen, sulfur, selenium, tellurium, nitrogen, phosphorus, arsenic, antimony, and carbon.

In the present specification, the composition of each layer including the first unit layer, the second unit layer, the underlying layer, an intermediate layer and the front surface layer, and a ratio of the number of atoms of each element (Zr, Si, B (boron), V) with respect to the total number of metal atoms in each layer can be measured with an X-ray photoelectron spectrometer (XPS). Specifically, a sample has a surface exposed to x-rays, and from the surface emits photoelectrons, and the photoelectrons' kinetic energy is measured to analyze the composition of an element constituting the surface of the sample and how the element is chemically bonded. In the XPS, by subjecting a sample to Ar ion etching while rotating the sample (Zalar rotation), each layer located on the side of the base material can also have determined its composition and a ratio of the number of atoms of each atom (Zr, Si, B, and V) with respect to the total number of metal atoms therein.

With alternate layer 13 having such a configuration, the surface coated cutting tool according to the present embodiment exhibits an excellent effect, that is, can achieve a long life while processing a difficult-to-cut material. It is inferred that this is achieved for the following grounds (i) to (vi):

(i) The first unit layer is composed of a nitride containing Al and Zr. Al is oxidizable and accordingly, a dense oxide layer composed of $Al_2O_3$ is easily formed on the side of the front surface of the coating layer. Furthermore, Zr has a smaller standard free energy for formation of oxide than Al does, and is thus more oxidizable than Al, so that a dense oxide layer composed of $ZrO_2$ is easily formed on an outermost surface of the coating layer. These oxide layers enhance the coating layer's resistance to oxidation, and the surface coated cutting tool including the coating layer can achieve a long life while processing a difficult-to-cut material.

(ii) When the total number of metal atoms constituting the first unit layer is represented as 1, a ratio thereto of the number of atoms of the Zr is not less than 0.65 and not more than 0.95. In that case, as estimated in an article written by Makino (Makino, "Structural Control and Properties of Pseudobinary Nitride Hard Coatings," Journal of the High Temperature Society, High Temperature Society, March 2007, Vol. 33, No. 2, pp. 50-59), the first unit layer will have a cubic crystal structure, and be increased in hardness and enhanced in wear resistance. The surface coated cutting tool including the first unit layer can thus achieve a long life.

(iii) The second unit layer is composed of a nitride containing Ti and Si. A layer composed of a nitride containing Ti and Si has a crystal structure in the form of a nanocomposite and is increased in hardness. The surface coated cutting tool including the second unit layer can thus be enhanced in wear resistance and achieve a long life.

(iv) When the total number of metal atoms constituting the second unit layer is represented as 1, a ratio thereto of the number of atoms of the Si is larger than 0 and not more than 0.20. In that case, characteristic peelability that the layer composed of a nitride containing Ti and Si has can be suppressed and the layer also has a crystal structure in the form of a nanocomposite, so that the layer is increased in hardness and enhanced in wear resistance. The surface coated cutting tool including the second unit layer can thus achieve a long life.

(v) When a layer composed of a nitride containing Al and Zr is compared with a layer composed of a nitride containing Ti and Si, the layer composed of the nitride containing Al and Zr tends to have large compressive residual stress and low hardness as characteristics and the layer composed of the nitride containing Ti and Si tends to have small compressive residual stress and high hardness as characteristics. The alternate layer includes a first unit layer composed of a nitride containing Al and Zr and a second unit layer composed of a nitride containing Ti and Si, with the first and second unit layers alternately stacked, and a characteristic of the first unit layer, i.e., low hardness, is complemented by that of the second unit layer, i.e., high hardness, and a characteristic of the second unit layer, i.e., small compressive residual stress, is complemented by that of the first unit layer, i.e., large compressive residual stress. It is thus believed that the alternate layer as a whole has hardness and compressive residual stress improved in a good balance and the surface coated cutting tool has a longer life.

(vi) The alternate layer has the first unit layer and the second unit layer alternately stacked, and has a composition and a crystal lattice discontinuously at an interface of each unit layer. In a cutting process when the coating layer has cracked at the front surface layer, the interface can suppress extension of the crack. The surface coated cutting tool is thus believed to have a longer life.

The first unit layer is composed of a nitride containing Al and Zr. Conventionally, when a layer containing Zr is formed through physical vapor deposition, Zr's high melting point makes it difficult to maintain electric discharge and hence stably deposit the layer. In the surface coated cutting tool of the present embodiment, the first unit layer contains Zr and, together therewith, Al having a low melting point, and accordingly, the first unit layer as a whole has a lowered melting point. As such, when the first unit layer is formed through physical vapor deposition, electric discharge is easily maintained and the layer can be stably deposited.

Furthermore, Zr is expensive, and it is disadvantageous in terms of cost to blend it in the coating layer of the surface coated cutting tool. The surface coated cutting tool of the present embodiment includes the coating layer composed of the first unit layer that contains Zr and the second unit layer that does not contain Zr, with the first and second unit layers alternately stacked, and the surface coated cutting tool can thus have a coating layer having a smaller Zr content than when the cutting tool has a coating layer formed of a single layer containing Zr. Therefore, it is also advantageous in terms of cost. Further, Zr is not contained in difficult-to-cut materials such as Inconel®, and Zr in the first unit layer does not interdiffuse with a component in a workpiece during a process to accelerate damage to the coating layer.

When the total number of metal atoms constituting the first unit layer is represented as 1, a ratio thereto of the number of atoms of the Zr is not less than 0.65 and not more than 0.95. In that case, the first unit layer will have a cubic crystal structure, and be increased in hardness and enhanced in wear resistance. If the ratio of the number of atoms of the Zr is less than 0.65, a part of the crystal structure becomes hexagonal, so that the first unit layer may be reduced in hardness and hence wear resistance. If the ratio of the number of atoms of the Zr is larger than 0.95, an effect by adding Al, that is, enhanced hardness, cannot be obtained, and the first unit layer would be reduced in hardness. From the viewpoint of further increasing the first unit layer in hardness, the ratio of the number of atoms of the Zr is preferably not less than 0.7 and not more than 0.85, and more preferably not less than 0.7 and not more than 0.8.

The second unit layer is composed of a nitride containing Ti and Si. A layer composed of a nitride containing Ti and Si has a crystal structure in the form of a nanocomposite and is increased in hardness. The second unit layer can thus contribute to providing the surface coated cutting tool with a long life. Further, Si is not contained in difficult-to-cut materials such as Inconel®, and Si in the second unit layer does not interdiffuse with a component in the workpiece during a process to accelerate damage to the coating layer.

When the total number of metal atoms constituting the second unit layer is represented as 1, a ratio thereto of the number of atoms of the Si is larger than 0 and not more than 0.20. In general, a layer composed of a nitride containing Ti and Si is characteristically peelable. In the present embodiment, the ratio of the number of atoms of the Si falling within the above range can suppress the peeling and also allows a crystal structure to be a nanocomposite. The second unit layer can thus be increased in hardness and enhanced in wear resistance. The second layer can thus contribute to providing the surface coated cutting tool with an extended long life.

If the ratio of the number of atoms of the Si exceeds 0.2, breaking resistance may decrease. From the viewpoint of further increasing the second unit layer in hardness, the ratio of the number of atoms of the Si is preferably not less than 0.05 and not more than 0.15, and more preferably not less than 0.05 and not more than 0.1.

The first unit layer can contain Si (silicon). When the first unit layer contains Si, and in the first unit layer the total number of metal atoms constituting the first unit layer is represented as 1, a ratio thereto of the number of atoms of the Si is preferably larger than 0 and not more than 0.20.

In that case, although what mechanism works is unknown, the layer containing Si is further increased in hardness and the coating layer as a whole is increased in hardness and also enhanced in oxidation resistance.

If the ratio of the number of atoms of the Si exceeds 0.20, the layer containing Si tends to become brittle, which accelerates wear. Furthermore, when a target made of an alloy serving as a source of metal for the layer containing Si is to be formed through a hot isostatic process, the target made of the alloy would be broken during baking, resulting in a poor yield, and it tends to be difficult to obtain material strength adequate for formation of the first unit layer.

From the viewpoint of increasing the first unit layer in hardness and enhancing the above target of alloy in strength, in the first unit layer, when the total number of metal atoms constituting the first unit layer is represented as 1, a ratio thereto of the number of atoms of the Si is preferably not less than 0.01 and not more than 0.10.

At least one of the first unit layer and the second unit layer can contain B (boron). When the first unit layer contains B, and in the first unit layer, the total number of metal atoms constituting the first unit layer is represented as 1, a ratio thereto of the number of atoms of the B is preferably larger than 0 and not more than 0.10. Similarly, when the second unit layer contains B, and in the second unit layer, the total number of metal atoms constituting the second unit layer is represented as 1, a ratio thereto of the number of atoms of the B is preferably larger than 0 and not more than 0.10.

In that case, although what mechanism works is unknown, the layer containing B is further increased in hardness and the coating layer as a whole is increased in hardness. Further, an oxide of B formed by oxidation of a surface during cutting densifies an oxide of Al in the layer and hence enhances oxidation resistance. Further, as the oxide of B has a low melting point, it can act as a lubricant in cutting a workpiece and thus suppress adhesion of the workpiece.

From the viewpoint of further improving the first or second unit layer in hardness and oxidation resistance, in the first and/or second unit layer, when the total number of metal atoms constituting the first or second unit layer is represented as 1, a ratio thereto of the number of atoms of the B is preferably not less than 0.05 and not more than 0.10.

At least one of the first unit layer and the second unit layer can contain V (vanadium). When the first unit layer contains vanadium, and in the first unit layer, the total number of metal atoms constituting the first unit layer is represented as 1, a ratio thereto of the number of atoms of the vanadium is preferably larger than 0 and not more than 0.30. Similarly, when the second unit layer contains vanadium, and in the second unit layer, the total number of metal atoms constituting the second unit layer is represented as 1, a ratio thereto of the number of atoms of the vanadium is preferably larger than 0 and not more than 0.30.

In that case, even if the first and/or second unit layer has a surface oxidized in a high-temperature environment in a process of cutting a workpiece, an oxide of V having a low melting point acts as a lubricant in the process, and can thus suppress adhesion of the workpiece.

If the ratio of the number of atoms of the V exceeds 0.30, the layer containing V tends to be decreased in hardness. From the viewpoint of suppressing the adhesion of the workpiece and increasing in hardness the layer containing V, in the first and/or second unit layer, when the total number of metal atoms constituting the first or second unit layer is represented as 1, a ratio thereto of the number of atoms of the V is preferably larger than 0 and less than 0.15.

The first unit layer and the second unit layer can include an inevitable impurity other than Al, Zr and N. The inevitable impurity includes oxygen, carbon or the like, for example. The first unit layer and the second unit layer preferably each contain inevitable impurity larger than 0 atomic % and less than 1 atomic % in total. In the present specification, "atomic %" refers to the percentage (%) of the number of atoms with respect to the total number of atoms constituting a layer. The percentage (%) of the number of atoms with respect to the total number of atoms constituting a layer can be measured using the above-described XPS analysis.

Preferably the first unit layer and the second unit layer each have a thickness of not less than 0.002 μm and not more than 0.2 μm. This enables suppression of extension of cracking caused in a surface of the coating layer. If the first unit layer and the second unit layer each have a thickness of less than 0.002 μm, the layers will be mixed with each other, which tends to prevent achieving an effect by alternately stacking the first and second unit layers. If the first and second unit layers each have a thickness exceeding 0.2 μm, an effect to suppress extension of cracking tends to be obtained less likely. More preferably the first unit layer and the second unit layer each have a thickness of not less than 0.005 μm and not more than 0.15 μm.

As shown in FIG. 3, when in the alternate layer the first unit layer and the second unit layer have a thickness $\lambda 1$ and a thickness $\lambda 2$, respectively, then, in the alternate layer the first unit layer and the second unit layer which are adjacent to each other preferably have a ratio $\lambda 2/\lambda 1$ of not less than 1 and not more than 5.

In addition to having high oxidation resistance, the second unit layer has a high thermal conductivity and has a property to easily transfer heat generated during cutting to the base material. Accordingly, when the proportion of the second unit layer in the coating layer is relatively increased, the surface coated cutting tool as a whole provides improved heat dissipation and is thus enhanced in wear resistance during continuous cutting, in particular. If $\lambda 2/\lambda 1$ is less than 1, the coating layer tends to be decreased in toughness. If $\lambda 2/\lambda 1$ exceeds 5, an effect by stacking the first and second unit layers to suppress extension of cracking tends to be obtained less likely. From the viewpoint of balancing these characteristics, $\lambda 2/\lambda 1$ is more preferably not less than 1 and less than 3.

The alternate layer can include one first unit layer and one second unit layer. In that case, on a side closest to the base material, the first unit layer may initially be deposited, followed by the second unit layer. Alternatively, on the side closest to the base material, the second unit layer may initially be deposited, followed by the first unit layer.

The alternate layer can include one or more first unit layers and one or more second unit layers. When the alternate layer includes two first unit layers and one second unit layer, then, on the side closest to the base material, one first unit layer may initially be deposited, followed by the second unit layer followed by the other first unit layer. When the alternate layer includes one first unit layer and two second unit layers, then, on the side closest to the base material, one second unit layer may initially be deposited, followed by the first unit layer followed by the other second unit layer.

The alternate layer may include two or more first unit layers and two or more second unit layers. In that case, on the side closest to the base material, a first unit layer may initially be deposited or a second unit layer may initially be deposited.

In the alternate layer, preferably 10-500 first unit layers and 10-500 second unit layers, more preferably 100-400 first unit layers and 100-400 second unit layers are stacked. Thus stacking the first and second unit layers allows hardness and compressive residual stress to be improved in a good balance sufficiently effectively.

The alternate layer preferably has an overall thickness of not less than 0.8 μm and not more than 15 μm, more preferably not less than 2 μm and not more than 7 μm. When the thickness is less than 0.8 μm, there is a tendency to be unable to exhibit sufficient wear resistance in continuous processing, and when it exceeds 15 μm, chipping resistance tends to be unstable in interrupted cutting.

The fact that in the alternate layer the first unit layer and the second unit layer are alternately stacked to form a multilayer structure can be confirmed as follows: a cross section of the coating layer is observed with a TEM (a transmission electron microscope) and when a difference in contrast is observed, it can be confirmed as indicating the multilayer structure.

The first unit layer's thickness, the second unit layer's thickness, how many first and second unit layers are stacked, and the alternate layer's thickness can be determined by observing a cross section of the coating layer with a TEM (a transmission electron microscope). Specifically, they can be determined as follows: a sliced sample is exposed to an electron beam and electrons transmitted through the sample or scattered by the sample are imaged and observed at high magnification.

<Another Layer>

According to the present embodiment, coating layer 3 included in surface coated cutting tool 1 can include another layer in addition to alternate layer 13. The other layer can for example include underlying layer 16, front surface layer 14, and the like.

Coating layer 3 can include underlying layer 16 between base material 2 and coating layer 3 in order to increase adhesion between base material 2 and coating layer 3. Underlying layer 16 preferably has the same composition as first unit layer 12 or second unit layer 15.

The underlying layer having the same composition as the first unit layer means that the underlying layer has the same composition as the first unit layer included in the alternate layer. In that case, the underlying layer is composed of a nitride containing Al and Zr, and when the total number of metal atoms constituting the underlying layer is represented as 1, a ratio thereto of the number of atoms of the Zr is not less than 0.65 and not more than 0.95.

When the underlying layer has the same composition as the first unit layer, and the base material is exposed in an initial stage of cutting, oxidation from the interface between the base material and the coating layer can be suppressed.

The underlying layer having the same composition as the first unit layer can contain Si, B or V, and their contents can be equal to those of the first unit layer. In particular, when the underlying layer contains Si, and the total number of metal atoms constituting the underlying layer is represented as 1, a ratio thereto of the number of atoms of the Si is preferably larger than 0 and not more than 0.10. This allows the underlying layer to be increased in hardness and also have a fine crystal structure, and hence be increased in wear resistance.

When the underlying layer has the same composition as the first unit layer, the underlying layer preferably has a thickness of not less than 0.1 μm. If the underlying layer has a thickness of less than 0.1 μm, there is a tendency to fail to obtain an effect by making the underlying layer have the same composition as the first unit layer to suppress oxidation caused from the interface between the base material and the coating layer. While the underlying layer has no particular upper limit value set for thickness, the underlying layer with a thickness exceeding 2 μm tends to be unable to further enhance the above oxidation suppressing effect. Therefore, when cost is considered the underlying layer preferably has a thickness of not more than 2 μm.

When the underlying layer has the same composition as the first unit layer, and the alternate layer is formed on the underlying layer, then, the alternate layer may have the first unit layer stacked directly on the underlying layer having the same composition as the first unit layer (see FIG. 1), or may have the second unit layer stacked directly thereon. Note that when the underlying layer has the same composition as the first unit layer and the alternate layer has the first unit layer stacked directly on the underlying layer, the underlying layer and the first unit layer of the alternate layer have a continuous crystal structure, and accordingly, will exist substantially as a layer composed of a single layer containing a nitride containing Al and Zr.

Accordingly, when the layer composed of a single layer of a nitride containing Al and Zr immediately above the base material is larger in thickness than another first unit layer in the alternate layer, it can be understood that the underlying layer having the same composition as the first unit layer and the first unit layer of the alternate layer closest to the base material exist continuously. In that case, the thickness λ1 of the first unit layer described above is the thickness of a first unit layer other than the first unit layer immediately adjacent to the underlying layer.

When the underlying layer has the same composition as the first unit layer, and the alternate layer has the first unit layer stacked directly on the underlying layer, the underlying layer and the first unit layer of the alternate layer have a continuous crystal structure. In that case, in appearance, a single layer having the same composition as the first unit layer is confirmed directly on the base material. In the present specification, when a single layer having the same composition as the first unit layer is present directly on the base material, and the layer has a thickness of not less than 100 nm, it is determined that the layer is composed of the underlying layer and the first unit layer.

The underlying layer having the same composition as the second unit layer means that the underlying layer has the same composition as the second unit layer included in the alternate layer. In that case, the underlying layer is composed of a nitride containing Ti and Si, and when the total number of metal atoms constituting the underlying layer is represented as 1, a ratio thereto of the number of atoms of the Si is larger than 0 and not more than 0.20.

When the underlying layer has the same composition as the second unit layer, the second unit layer tends to have a small stress, and the coating layer is significantly improved in resistance against peeling in interrupted processing, such as milling and end milling, in which the cutting edge repeatedly receives a load. From the viewpoint of improved peeling resistance, when the total number of metal atoms constituting the underlying layer is represented as 1, a ratio thereto of the number of atoms of the Si is preferably not less than 0.01 and not more than 0.1.

The underlying layer having the same composition as the second unit layer can contain B or V, and their contents can be equal to those of the second unit layer.

When the underlying layer has the same composition as the second unit layer, the underlying layer preferably has a thickness of not less than 0.1 μm. If the underlying layer has a thickness of less than 0.1 μm, there is a tendency to be unable to obtain an effect by making the underlying layer have the same composition as the second unit layer to enhance peeling resistance. While the underlying layer has no particular upper limit value set for thickness, the underlying layer with a thickness exceeding 2 μm tends not to be recognized to further enhance the above peeling resistance. Therefore, when cost is considered the underlying layer preferably has a thickness of not more than 2 μm.

When the underlying layer has the same composition as the second unit layer, and the alternate layer is formed on the underlying layer, then, the alternate layer may have the first unit layer stacked directly on the underlying layer having the same composition as the second unit layer (see FIG. 2), or may have the second unit layer stacked directly thereon. Note that when the underlying layer has the same composition as the second unit layer and the alternate layer has the second unit layer stacked directly on the underlying layer, the underlying layer and the second unit layer of the alternate layer have a continuous crystal structure, and accordingly, will exist substantially as a layer composed of a single layer containing a nitride containing Ti and Si.

Accordingly, when the layer composed of a single layer of a nitride containing Ti and Si immediately on the base material is larger in thickness than another second unit layer in the alternate layer, it can be understood that the underlying layer having the same composition as the second unit layer and the second unit layer of the alternate layer closest to the base material exist continuously. In that case, the thickness λ2 of the second unit layer described above is the thickness of a second unit layer other than the second unit layer immediately adjacent to the underlying layer.

When the underlying layer has the same composition as the second unit layer, and the alternate layer has the second unit layer stacked directly on the underlying layer, the underlying layer and the second unit layer of the alternate layer have a continuous crystal structure. In that case, in appearance, a single layer having the same composition as the second unit layer is confirmed directly on the base material. In the present specification, when a single layer having the same composition as the second unit layer is present directly on the base material, and the layer has a thickness of not less than 100 nm, it is determined that the layer is composed of the underlying layer and the first unit layer.

Coating layer 3 can include front surface layer 14 on the side of the front surface of alternate layer 13 in order to reduce the coefficient of friction of coating layer 3 and extend the lifetime of the surface coated cutting tool. The front surface layer is preferably composed of a carbonitride (a compound containing carbon and nitrogen) containing Ti.

Generally, a carbonitride tends to have a lower coefficient of friction with a workpiece than a nitride does. Such a smaller coefficient of friction is considered to be attributed to contribution of carbon atoms. When the coating layer includes the front surface layer, the coating layer has a reduced coefficient of friction with a workpiece and the surface coated cutting tool has an extended lifetime.

The front surface layer is composed of a carbonitride containing Ti and Si, and when the total number of metal atoms constituting the front surface layer is represented as 1, a ratio thereto of the number of atoms of the Si is preferably larger than 0 and not more than 0.20. When the total number of metal atoms constituting the front surface layer is represented as 1, the ratio thereto of the number of atoms of the Si is preferably not less than 0.01 and not more than 0.15, more preferably not less than 0.05 and not more than 0.1. This allows the front surface layer to be increased in hardness and also enhanced in oxidation resistance.

By adjusting the composition ratio of N and C in the front surface layer, a prescribed color can be imparted thereto. This allows the surface coated cutting tool to have an appearance with designability and distinctiveness commercially usefully.

The front surface layer can contain Al. A carbonitride containing Ti and Al has excellent oxidation resistance. Although the front surface layer has a surface heated to a higher temperature than any other layer in a cutting process, the front surface layer that has excellent oxidation resistance allows the surface coated cutting tool to have an extended lifetime. From the viewpoint of enhancing oxidation resistance, when the total number of metal atoms constituting the front surface layer is represented as 1, the ratio thereto of the number of atoms of the Al is preferably larger than 0.40 and not more than 0.70, more preferably not less than 0.50 and not more than 0.60.

The front surface layer can contain B and when the total number of metal atoms constituting the front surface layer is represented as 1, a ratio thereto of the number of atoms of the B is preferably larger than 0 and less than 0.10, more preferably larger than 0 and not more than 0.05. This allows the front surface layer to be increased in hardness. Further, an oxide of B formed by oxidation of a surface during cutting tends to densify an oxide of Al in the layer, which enhances oxidation resistance.

The front surface layer can contain V and when the total number of metal atoms constituting the front surface layer is represented as 1, a ratio thereto of the number of atoms of the V is preferably larger than 0 and not more than 0.10, more preferably larger than 0 and not more than 0.05. This can enhance the front surface layer in adhesion resistance.

The front surface layer preferably has a thickness of not less than 0.1 μm. If the front surface layer has a thickness of less than 0.1 μm, an effect of the front surface layer to impart lubricity may not be easily obtained. While the front surface layer has no particular upper limit value set for thickness, the front surface layer with a thickness exceeding 2 μm tends to be unable to further enhance the above lubricity imparting effect. Therefore, when cost is considered the front surface layer preferably has a thickness of not more than 2 μm.

<Method for Manufacturing Surface Coated Cutting Tool>

A method for manufacturing a surface coated cutting tool according to one embodiment of the present disclosure described above includes: preparing a base material; and alternately stacking a first unit layer and a second unit layer on the base material through physical vapor deposition to form an alternate layer to obtain the surface coated cutting tool.

<Preparing a Base Material>

As a base material, the base material described above is prepared.

<Forming an Alternate Layer>

Subsequently, on the base material, physical vapor deposition (PVD) is applied to alternately stack the first unit layer and the second unit layer on the base material to form an alternate layer on the base material to obtain the surface coated cutting tool according to one embodiment of the present disclosure. In order to improve in wear resistance the coating layer including the alternate layer, it is preferable to form a layer from a compound having high crystallinity. Through investigation of various methods for forming the alternate layer, the present inventors have found that physical vapor deposition is preferably used. Note that directly on the base material, an underlying layer can be formed to enhance adhesion between the base material and the coating layer.

As physical vapor deposition, at least one selected from the group consisting of cathodic arc ion plating, balanced magnetron sputtering and unbalanced magnetron sputtering, and HiPIMS can be used. In particular, cathodic arc ion plating is preferably used as it allows an element serving as a source material to be ionized at a high ratio. When cathodic arc ion plating is used, then, before the alternate layer is formed, the base material can have a surface subjected to metal ion bombardment to achieve significantly enhanced adhesion of the base material and the coating layer including the alternate layer.

Cathodic arc ion plating can be performed for example as follows: the base material is set in an apparatus and a target is also set as a cathode, and subsequently, a high voltage is applied to the target to cause arc discharge to ionize and evaporate the target's constituent atoms to deposit material on the base material.

balanced magnetron sputtering can be performed for example as follows: a base material is set in an apparatus and a target is also set on a magnetron electrode provided with a magnet that forms a balanced magnetic field, and high-frequency power is applied between the magnetron electrode and the base material to generate a gas plasma, which generates a gas, and the gas's ions are caused to impinge on the target to release atoms therefrom to deposit the released atoms on the base material.

Unbalanced magnetron sputtering can be performed for example by making unbalanced the magnetic field generated by the magnetron electrode in the balanced magnetron sputtering described above. Further, HiPIMS allowing high voltage to be applied and a dense film to be obtained can also be used.

Note that another layer, such as an intermediate layer, an alumina layer, and a front surface layer, can be formed on the alternate layer. The other layer can be formed by chemical vapor deposition or physical vapor deposition as conventionally known. The other layer is preferably formed through physical vapor deposition from the viewpoint that the other layer can be formed with the first unit layer and the second unit layer in a single physical vapor deposition apparatus sequentially.

EXAMPLES

Figure 4:
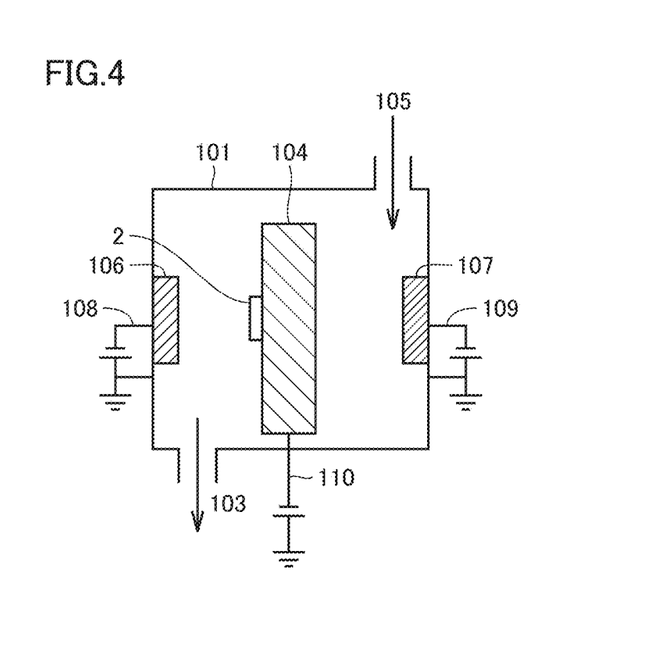
FIG. 4 is a schematic cross section of a cathodic arc ion plating apparatus used in an embodiment.
Figure 5:
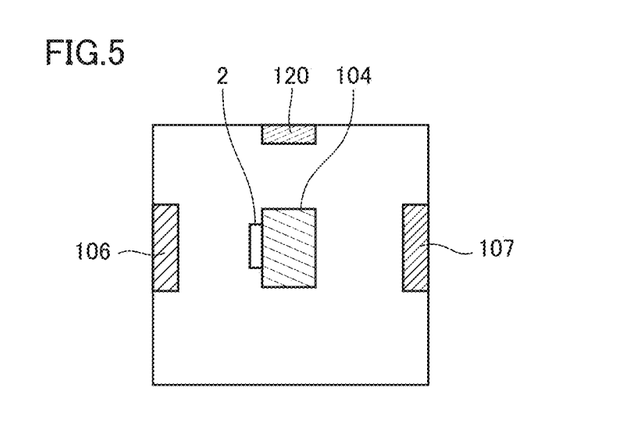
FIG. 5 is a schematic top view of the cathodic arc ion plating apparatus shown in FIG. 4.

<Fabricating Surface Coated Cutting Tool>
[Samples 1 to 23]
(1) Washing the Base Material FIG. 4 is a schematic cross section of a cathodic arc ion plating apparatus used in the present example, and FIG. 5 is a schematic top view of the apparatus shown in FIG. 4.

In the apparatus shown in FIGS. 4 and 5, a cathode 106 for the first unit layer, a cathode 107 for the second unit layer, and a cathode 120 for the front surface layer, which are targets made of alloys serving as sources for metals for the coating layer, and a rotary-type base material holder 104 for placing base material 2 are set in a chamber 101. An arc power supply 108 is attached to cathode 106, and an arc power supply 109 is attached to cathode 107. A bias power supply 110 is attached to base material holder 104. Further provided to chamber 101 are a gas inlet through which gas 105 is introduced therein, and a gas outlet 103 for adjusting the pressure within chamber 101, and the gas in chamber 101 can be sucked by a vacuum pump via gas outlet 103.

Base material 2 of a cemented carbide having a grade of JIS P30 and shaped according to JIS CNMG120408, and an insert of SEMT13T3AGSN manufactured by Sumitomo Electric Hardmetal Corp. were attached to base material holder 104.

Subsequently, a vacuum pump was used to internally vacuum chamber 101, and while base material 2 was also rotated, a heater set in the apparatus was operated to raise temperature to 500° C., and chamber 101 was thus internally vacuumed to attain a pressure of $1.0 \times 10^{-4}$ Pa. Subsequently, gaseous argon was introduced via the gas inlet, and the pressure within chamber 101 was held at 3.0 Pa. The voltage of bias power supply 110 was gradually increased to −1000 V, and base material 2 had a surface cleaned for 15 minutes. Subsequently, the gaseous argon was exhausted from chamber 101 to wash the base material (i.e., an argon bombardment treatment).

(2) Forming the Coating Layer

Subsequently, with base material 2 being rotated at the center, while gaseous nitrogen was introduced as a reactive gas, and base material 2 was held at to 500° C., the reactive gas was held in pressure at 2.0 Pa and bias power supply 110 had a voltage held at a fixed value in a range of −50 V to −200 V, cathodes 106 and 107 were each supplied with an arc current of 100 A and thus caused to generate metal ions to form an underlying layer and an alternate layer having the compositions shown in Table 1. Note that cathode 106 had a composition adjusted to have Zr, Al, Si, B, and V at a ratio equal to that of a composition of the first unit layer indicated in Table 1. Furthermore, cathode 107 had a composition adjusted to have Ti, Si, B, and V at a ratio equal to that of a composition of the second unit layer indicated in Table 1.

The alternate layer was formed by stacking on the underlying layer the first unit layer and the second unit layer, one on the other alternately by the numbers of stacked layers indicated in Table 1. Further, the thickness of the underlying layer, that of each of the first and second unit layers in the alternate layer, and how many first and second unit layers were stacked were adjusted by the speed of rotation of the base material. A current supplied to an evaporation source was stopped when the underlying layer and the alternate layer each achieved a value in thickness indicated in Table 1.

Subsequently, while nitrogen and methane gas were introduced as reactive gas into chamber 101, and base material 2 was held at 400° C., the reactive gas was held in pressure at 2.0 Pa and bias power supply 110 had a voltage held at −350 V, cathode 120 was supplied with an arc current of 100 A and thus caused to generate metal ions to form the front surface layer on the alternate layer. A current supplied to the evaporation source was stopped when the front surface layer achieved a value in thickness indicated in Table 1. Note that cathode 120 had a composition adjusted to have Al, Ti, Si, B, and V at a ratio equal to that of a composition of the front surface layer indicated in Table 1. The ratio of nitrogen to carbon in the composition of the front surface layer was adjusted by the ratio of the amount of nitrogen introduced and the amount of methane gas introduced. Indexable cutting inserts of samples 1 to 3, 6 to 14, 16, 17, 20, 21, and 23 were thus produced.

The indexable cutting inserts of samples 4 and 5 were each fabricated as follows: on the same base material as sample 1, first and second unit layers each having a composition shown in Table 1 were alternately formed and furthermore, the front surface layer was formed, and the underlying layer was not formed.

The indexable cutting insert of sample 15 was fabricated as follows: on the same base material as sample 1, first and second unit layers each having a composition shown in Table 1 were alternately formed and the underlying layer and the front surface layer were not formed.

The indexable cutting insert of sample 18 was fabricated as follows: on the same base material as sample 1, a second unit layer having a composition shown in Table 1 was alone formed and the underlying layer, the first unit layer, and the front surface layer were not formed.

The indexable cutting inserts of samples 19 and 22 were each fabricated as follows: on the same base material as sample 1, an underlying layer having a composition shown in Table 1 was formed and first and second unit layers each having a composition shown in Table 1 were alternately formed, and the front surface layer was not formed.

TABLE 1

| | underlying layer | | alternate layer | | | | | |
|---|---|---|---|---|---|---|---|---|
| | | | 1st unit layer | | | 2nd unit layer | | |
| | composition | thickness (μm) | composition | thickness per layer (μm) | no. of layers stacked (no.) | thickness (μm) | composition | thickness per layer (μm) | no. of layers stacked (no.) |

| | composition | thickness (μm) | composition | thickness per layer (μm) | no. of layers stacked (no.) | thickness (μm) | composition | thickness per layer (μm) | no. of layers stacked (no.) |
|---|---|---|---|---|---|---|---|---|---|
| sample 1 | $Zr_{0.7}Al_{0.3}N$ | 0.5 | $Zr_{0.7}Al_{0.3}N$ | 0.15 | 10 | 1.5 | $Ti_{0.9}Si_{0.1}N$ | 0.15 | 10 |
| sample 2 | $Zr_{0.7}Al_{0.3}N$ | 0.5 | $Zr_{0.7}Al_{0.3}N$ | 0.05 | 30 | 1.5 | $Ti_{0.9}Si_{0.1}N$ | 0.05 | 30 |
| sample 3 | $Zr_{0.7}Al_{0.3}N$ | 0.5 | $Zr_{0.7}Al_{0.3}N$ | 0.005 | 300 | 1.5 | $Ti_{0.9}Si_{0.1}N$ | 0.005 | 300 |
| sample 4 | — | — | $Zr_{0.65}Al_{0.35}N$ | 0.005 | 350 | 1.75 | $Ti_{0.9}Si_{0.1}N$ | 0.005 | 350 |
| sample 5 | — | — | $Zr_{0.8}Al_{0.2}N$ | 0.005 | 350 | 1.75 | $Ti_{0.9}Si_{0.1}N$ | 0.005 | 350 |
| sample 6 | $Ti_{0.95}Si_{0.05}N$ | 0.5 | $Zr_{0.7}Al_{0.3}N$ | 0.01 | 150 | 1.5 | $Ti_{0.95}Si_{0.05}N$ | 0.01 | 150 |
| sample 7 | $Ti_{0.85}Si_{0.15}N$ | 0.5 | $Zr_{0.7}Al_{0.3}N$ | 0.01 | 150 | 1.5 | $Ti_{0.85}Si_{0.15}N$ | 0.01 | 150 |
| sample 8 | $Zr_{0.68}Al_{0.27}Si_{0.05}N$ | 0.5 | $Zr_{0.68}Al_{0.27}Si_{0.05}N$ | 0.005 | 300 | 1.5 | $Ti_{0.9}Si_{0.1}N$ | 0.005 | 300 |
| sample 9 | $Zr_{0.68}Al_{0.27}B_{0.05}N$ | 0.5 | $Zr_{0.68}Al_{0.27}Si_{0.05}N$ | 0.005 | 300 | 1.5 | $Ti_{0.9}Si_{0.1}N$ | 0.005 | 300 |
| sample 10 | $Zr_{0.68}Al_{0.27}V_{0.05}N$ | 0.5 | $Zr_{0.68}Al_{0.27}Si_{0.05}N$ | 0.005 | 300 | 1.5 | $Ti_{0.9}Si_{0.1}N$ | 0.005 | 300 |
| sample 11 | $Zr_{0.7}Al_{0.3}N$ | 0.5 | $Zr_{0.7}Al_{0.3}N$ | 0.005 | 300 | 1.5 | $Ti_{0.9}Si_{0.05}B_{0.05}N$ | 0.005 | 300 |
| sample 12 | $Zr_{0.7}Al_{0.3}N$ | 0.5 | $Zr_{0.7}Al_{0.3}N$ | 0.005 | 300 | 1.5 | $Ti_{0.9}Si_{0.05}V_{0.05}N$ | 0.005 | 300 |
| sample 13 | $Zr_{0.7}Al_{0.3}N$ | 0.5 | $Zr_{0.7}Al_{0.3}N$ | 0.003 | 270 | 0.8 | $Ti_{0.9}Si_{0.1}N$ | 0.008 | 270 |
| sample 14 | $Zr_{0.7}Al_{0.3}N$ | 0.5 | $Zr_{0.7}Al_{0.3}N$ | 0.002 | 250 | 0.5 | $Ti_{0.9}Si_{0.1}N$ | 0.01 | 250 |
| sample 15 | — | — | $Zr_{0.7}Al_{0.3}N$ | 0.005 | 400 | 2 | $Ti_{0.9}Si_{0.1}N$ | 0.005 | 400 |
| sample 16 | ZrN | 0.5 | ZrN | 0.05 | 30 | 1.5 | $Ti_{0.9}Si_{0.1}N$ | 0.05 | 30 |
| sample 17 | $Zr_{0.6}Al_{0.4}N$ | 0.5 | $Zr_{0.6}Al_{0.4}N$ | 0.15 | 10 | 1.5 | $Ti_{0.9}Si_{0.1}N$ | 0.15 | 10 |
| sample 18 | — | — | — | — | — | — | $Al_{0.6}Ti_{0.4}N$ | 4 | 1 |
| sample 19 | $Al_{0.6}Ti_{0.4}N$ | 0.5 | $Al_{0.7}Cr_{0.3}N$ | 0.005 | 350 | 1.75 | $Al_{0.6}Ti_{0.4}N$ | 0.005 | 350 |
| sample 20 | $Zr_{0.7}Al_{0.3}N$ | 0.5 | $Zr_{0.7}Al_{0.3}N$ | 0.05 | 30 | 1.5 | TiN | 0.05 | 30 |
| sample 21 | $Zr_{0.7}Al_{0.3}N$ | 0.5 | $Zr_{0.7}Al_{0.3}N$ | 0.05 | 30 | 1.5 | $Ti_{0.9}Si_{0.1}N$ | 0.05 | 30 |
| sample 22 | $Zr_{0.7}Al_{0.3}N$ | 0.5 | $Zr_{0.7}Al_{0.3}N$ | 0.03 | 78 | 2.3 | $Ti_{0.9}Si_{0.1}N$ | 0.015 | 78 |
| sample 23 | $Zr_{0.7}Al_{0.3}N$ | 0.5 | $Zr_{0.7}Al_{0.3}N$ | 0.015 | 22 | 0.3 | $Ti_{0.9}Si_{0.1}N$ | 0.12 | 22 |

| | alternate layer 2nd unit layer thickness (μm) | $\lambda 2/\lambda 1$ | front surface layer composition | front surface layer thickness (μm) | coating layer as a whole thickness (μm) | hardness (GPa) | compressive residual stress (GPa) | crystallinity |
|---|---|---|---|---|---|---|---|---|
| sample 1 | 1.5 | 1 | $Ti_{0.9}Si_{0.1}CN$ | 0.5 | 4.0 | 49 | 2.1 | cubic |
| sample 2 | 1.5 | 1 | $Ti_{0.9}Si_{0.1}CN$ | 0.5 | 4.0 | 50 | 2.0 | cubic |
| sample 3 | 1.5 | 1 | $Ti_{0.9}Si_{0.1}CN$ | 0.5 | 4.0 | 52 | 2.3 | cubic |
| sample 4 | 1.75 | 1 | $Ti_{0.9}Si_{0.1}CN$ | 0.5 | 4.0 | 46 | 2.1 | cubic |
| sample 5 | 1.75 | 1 | $Ti_{0.9}Si_{0.1}CN$ | 0.5 | 4.0 | 44 | 2.1 | cubic |
| sample 6 | 1.5 | 1 | $Ti_{0.95}Si_{0.05}CN$ | 0.5 | 4.0 | 43 | 2.0 | cubic |
| sample 7 | 1.5 | 1 | $Ti_{0.85}Si_{0.15}CN$ | 0.5 | 4.0 | 46 | 2.3 | cubic |
| sample 8 | 1.5 | 1 | $Al_{0.6}Ti_{0.4}CN$ | 0.5 | 4.0 | 58 | 2.3 | cubic |
| sample 9 | 1.5 | 1 | $Al_{0.6}Ti_{0.4}CN$ | 0.5 | 4.0 | 53 | 2.2 | cubic |
| sample 10 | 1.5 | 1 | $Al_{0.6}Ti_{0.4}CN$ | 0.5 | 4.0 | 55 | 2.2 | cubic |
| sample 11 | 1.5 | 1 | $Al_{0.6}Ti_{0.35}B_{0.05}CN$ | 0.5 | 4.0 | 52 | 2.0 | cubic |
| sample 12 | 1.5 | 1 | $Al_{0.6}Ti_{0.35}V_{0.05}CN$ | 0.5 | 4.0 | 54 | 2.3 | cubic |
| sample 13 | 2.2 | 2.7 | $Ti_{0.9}Si_{0.1}CN$ | 0.5 | 4.0 | 53 | 2.2 | cubic |
| sample 14 | 2.5 | 5.0 | $Ti_{0.9}Si_{0.1}CN$ | 0.5 | 4.0 | 51 | 1.9 | cubic |
| sample 15 | 2 | 1 | — | — | 4.0 | 53 | 2.0 | cubic |
| sample 16 | 1.5 | 1 | $Ti_{0.9}Si_{0.1}CN$ | 0.5 | 4.0 | 42 | 2.2 | cubic |
| sample 17 | 1.5 | 1 | $Ti_{0.9}Si_{0.1}CN$ | 0.5 | 4.0 | 38 | 1.9 | cubic + hexagonal |
| sample 18 | 4 | — | — | — | 4.0 | 32 | 2.1 | cubic |
| sample 19 | 1.75 | 1 | — | — | 4.0 | 40 | 2.5 | cubic |
| sample 20 | 1.5 | 1 | $Ti_{0.9}Si_{0.1}CN$ | 0.5 | 4.0 | 50 | 2.0 | cubic |
| sample 21 | 1.5 | 1 | $Ti_{0.9}Si_{0.1}CN$ | 0.5 | 4.0 | 50 | 2.0 | cubic |
| sample 22 | 1.2 | 0.5 | — | — | 4.0 | 34 | 2.2 | cubic |
| sample 23 | 2.6 | 8 | $Al_{0.6}Ti_{0.4}CN$ | 0.5 | 4.0 | 29 | 1.6 | cubic |

The compositions of the underlying layer, the first unit layer, the second unit layer, and the front surface layer shown in Table 1 were measured using an XPS (X-ray photoelectron spectrometer).

In table 1, "thickness per layer" means the thickness of each one layer of the first and second unit layers configuring the alternate layer. In table 1, "thickness" means a total thickness of each of the underlying layer, the first unit layer, the second unit layer, the front surface layer, and the coating layer. "Thickness per layer" and "thickness" were values measured with a TEM and a SEM, respectively.

In table 1, "no. of layers stacked" refers to how many first unit layers are stacked in the alternate layer and how many second unit layers were stacked in the alternate layer.

In table 1, "hardness" of "coating layer as a whole" was a value confirmed with a nano indenter (Nano Indenter XP manufactured by MTS).

In table 1, "compressive residual stress" of "coating layer as a whole" was a value measured in the $\sin^2 \varphi$ method using an X-ray residual stress measuring apparatus (see "X-Ray Stress Measurement," The Society of Materials Science, Japan, 1981, Published by Yokendo Co., Ltd., pp. 54-66).

In table 1, "crystallinity" of "coating layer as a whole" was obtained through an analysis using an X-ray diffractometer.

<Evaluating Lifetime of Surface Coated Cutting Tool>
(Turning Test)

The indexable cutting inserts of samples 1 to 23 having the CNMG120408 shape were each subjected to a wet continuous turning test and interrupted turning test to process each workpiece under the conditions shown in Table 2 to measure a period of time elapsing before the insert had a cutting edge with a flank worn by an amount of 0.2 mm. A result is shown in Table 3. In Table 3, a longer cutting time indicates a longer lifetime.

TABLE 2

|  | continuous cutting (turning) | interrupted cutting (turning) | continuous cutting (turning) |
|---|---|---|---|
| workpiece | SCM440 (HB = 300) | SCM440 (HB = 300) | Inconel ® 718 (aged material: HB = 400) |
| cutting speed (m/min) | 350 | 320 | 80 |
| feed rate (mm/rev) | 0.35 | 0.3 | 0.2 |
| cutting (mm) | 2.0 | 1.5 | 1.5 |
| coolant | water-soluble | water-soluble | water-soluble |

TABLE 3

| | cutting time (min.) | | |
|---|---|---|---|
|  | SCM440 continuous cutting (turning) | SCM440 interrupted cutting (turning) | Inconel ® 718 continuous (turning) |
| sample 1 | 85 | 91 | 86 |
| sample 2 | 86 | 92 | 87 |
| sample 3 | 89 | 93 | 88 |
| sample 4 | 86 | 88 | 85 |
| sample 5 | 86 | 90 | 86 |
| sample 6 | 87 | 91 | 89 |
| sample 7 | 85 | 94 | 90 |
| sample 8 | 111 | 93 | 98 |
| sample 9 | 98 | 99 | 96 |
| sample 10 | 101 | 97 | 97 |
| sample 11 | 96 | 101 | 93 |
| sample 12 | 99 | 94 | 91 |

TABLE 3-continued

| | cutting time (min.) | | |
|---|---|---|---|
|  | SCM440 continuous cutting (turning) | SCM440 interrupted cutting (turning) | Inconel ® 718 continuous (turning) |
| sample 13 | 95 | 92 | 89 |
| sample 14 | 92 | 95 | 92 |
| sample 15 | 86 | 89 | 83 |
| sample 16 | 40 | 42 | 39 |
| sample 17 | 44 | 44 | 39 |
| sample 18 | 25 | 30 | 15 |
| sample 19 | 40 | 45 | 40 |
| sample 20 | 15 | 20 | 15 |
| sample 21 | 20 | 20 | 20 |
| sample 22 | 81 | 84 | 80 |
| sample 23 | 76 | 78 | 77 |

The indexable cutting inserts of samples 1 to 15, 22 and 23 correspond to examples, and the indexable cutting inserts of samples 16 to 21 correspond to comparative examples. When samples 1 to 15, 22 and 23 were compared with samples 16 to 21, the former had a cutting edge with a flank worn in a significantly reduced amount in both the continuous turning test and the interrupted turning test, and it has been confirmed that the former allows a difficult-to-cut material to be also processed fast and significantly efficiently while the indexable cutting insert has a significantly extended lifetime.

(Milling Test)

The SEMT13T3AGSN-shaped indexable cutting inserts of samples 1 to 23 were each used, with a 150 mm-wide plate as each workpiece having a center line aligned with the center of a cutter of φ160 mm wider than the plate, to mill a surface under conditions for a dry milling test, as shown in Table 4, to measure a cut length achieved before the cutting edge had a flank worn by an amount of 0.2 mm. A result is shown in Table 5. In Table 5, a longer cut length indicates a longer lifetime.

TABLE 4

| workpiece | milling SKD11 (HB = 235) | milling FCD700 (HB = 250) |
|---|---|---|
| cutting speed (m/min) | 150 | 200 |
| feed rate (mm/t) | 0.15 | 0.2 |
| axial cutting ap (mm) | 1.5 | 2.0 |
| radial cutting ae (mm) | 150 | 150 |
| coolant | dry | dry | evaluated by center-cutting with a φ160 mm cutter

TABLE 5

| | cutting length (km) | |
|---|---|---|
|  | SKD11 milling | FCD700 milling |
| sample 1 | 4.3 | 4.5 |
| sample 2 | 4.5 | 4.5 |
| sample 3 | 4.8 | 4.6 |
| sample 4 | 4.1 | 4.3 |
| sample 5 | 3.9 | 4.1 |
| sample 6 | 3.9 | 4.0 |
| sample 7 | 4.1 | 4.2 |
| sample 8 | 6.2 | 5.5 |
| sample 9 | 5.7 | 6.1 |
| sample 10 | 5.9 | 5.6 |
| sample 11 | 5.6 | 5.9 |
| sample 12 | 5.8 | 5.7 |
| sample 13 | 5.1 | 5.0 |

TABLE 5-continued

| | cutting length (km) | |
|---|---|---|
| | SKD11 milling | FCD700 milling |
| sample 14 | 4.8 | 4.7 |
| sample 15 | 4.5 | 4.4 |
| sample 16 | 1.9 | 2.3 |
| sample 17 | 1.6 | 2.1 |
| sample 18 | 1.0 | 1.5 |
| sample 19 | 1.5 | 2.0 |
| sample 20 | 0.5 | 1.0 |
| sample 21 | 1.1 | 1.3 |
| sample 22 | 4.1 | 4.2 |
| sample 23 | 4.0 | 4.1 |

Samples 1 to 15, 22 and 23 correspond to examples, and samples 16 to 21 correspond to comparative examples. When samples 1 to 15, 22 and 23 are compared with samples 16 to 21, the former allows a cutting edge to provide a significantly increased cut length, and it has been confirmed that the former also allows fast and highly efficient, dry milling to be performed while the indexable cutting insert has a significantly extended lifetime.

Thus while embodiments and examples of the present disclosure have been described, it is also initially planned to combine and variously modify configurations of the embodiments and examples, as appropriate.

It should be understood that the embodiment and example disclosed herein have been described for the purpose of illustration only and in a non-restrictive manner in any respect. The scope of the present invention is defined by the terms of the claims, rather than the embodiments and examples described above, and is intended to include any modifications within the meaning and scope equivalent to the terms of the claims.

REFERENCE SIGNS LIST

1 surface coated cutting tool, 2 base material, 3 coating layer, 12 first unit layer, 13 alternate layer, 14 front surface layer, 15 second unit layer, 16 underlying layer, 101 chamber, 103 gas outlet, 104 base material holder, 105 gas, 106, 107, 120 cathode, 108, 109 arc power supply, 110 bias power supply.

The invention claimed is:

1. A surface coated cutting tool comprising a base material and a coating layer that coats the base material,
   the coating layer including an alternate layer composed of a first unit layer and a second unit layer alternately stacked,
   the first unit layer being composed of a nitride containing aluminum and zirconium,
   in the first unit layer, when the total number of metal atoms constituting the first unit layer is represented as 1, a ratio thereto of the number of atoms of the zirconium being not less than 0.65 and not more than 0.95,
   the second unit layer being composed of a nitride containing titanium and silicon,
   in the second unit layer, when the total number of metal atoms constituting the second unit layer is represented as 1, a ratio thereto of the number of atoms of the silicon being larger than 0 and not more than 0.20,
   wherein when in the alternate layer the first unit layer and the second unit layer which are adjacent to each other have a thickness $\lambda 1$ and a thickness $\lambda 2$, respectively, a ratio $\lambda 2/\lambda 1$ is not less than 2.7.

2. The surface coated cutting tool according to claim 1, wherein the ratio $\lambda 2/\lambda 1$ is not less than 2.7 and is not more than 5.

3. The surface coated cutting tool according to claim 1, wherein
   the first unit layer contains silicon, and
   in the first unit layer, when the total number of metal atoms constituting the first unit layer is represented as 1, a ratio thereto of the number of atoms of the silicon is larger than 0 and is not more than 0.20.

4. The surface coated cutting tool according to claim 1, wherein
   the first unit layer contains boron, and
   in the first unit layer, when the total number of metal atoms constituting the first unit layer is represented as 1, a ratio thereto of the number of atoms of the boron is larger than 0 and is not more than 0.10.

5. The surface coated cutting tool according to claim 1, wherein
   the second unit layer contains boron, and
   in the second unit layer, when the total number of metal atoms constituting the second unit layer is represented as 1, a ratio thereto of the number of atoms of the boron is larger than 0 and is not more than 0.10.

6. The surface coated cutting tool according to claim 1, wherein
   the first unit layer contains vanadium, and
   in the first unit layer, when the total number of metal atoms constituting the first unit layer is represented as 1, a ratio thereto of the number of atoms of the vanadium is larger than 0 and is not more than 0.30.

7. The surface coated cutting tool according to claim 1, wherein
   the second unit layer contains vanadium, and
   in the second unit layer, when the total number of metal atoms constituting the second unit layer is represented as 1, a ratio thereto of the number of atoms of the vanadium is larger than 0 and is not more than 0.30.

8. The surface coated cutting tool according to claim 1, wherein the first unit layer and the second unit layer each have a thickness of not less than 0.002 μm and not more than 0.2 μm.

9. The surface coated cutting tool according to claim 1, wherein
   the coating layer includes an underlying layer disposed between the base material and the alternate layer and
   the underlying layer has a composition identical to that of the first unit layer or the second unit layer.

10. The surface coated cutting tool according to claim 1, wherein
    the coating layer includes a front surface layer disposed on a side of a front surface of the alternate layer, and
    the front surface layer is composed of a carbonitride containing titanium.

11. A method for manufacturing a surface coated cutting tool according to claim 1, comprising:
    preparing the base material; and
    alternately stacking the first unit layer and the second unit layer on the base material through physical vapor deposition to form the alternate layer on the base material to obtain the surface coated cutting tool.

12. The surface coated cutting tool according to claim 1, wherein the ratio $\lambda 2/\lambda 1$ is not less than 2.7 and is less than 3.

13. The surface coated cutting tool according to claim 1, wherein the coating layer has compressive residual stress of not more than 6 GPa in absolute value.

14. The surface coated cutting tool according to claim 1, wherein the coating layer has a cubic crystal structure.

15. The surface coated cutting tool according to claim 1, wherein the ratio $\lambda 2/\lambda 1$ is not less than 2.7 and not more than 8.

\* \* \* \* \*